US009699897B2

(12) United States Patent
Chen et al.

(10) Patent No.: US 9,699,897 B2
(45) Date of Patent: Jul. 4, 2017

(54) PAD STRUCTURE

(71) Applicant: Taiwan Semiconductor Manufacturing Company Limited, Hsin-Chu (TW)

(72) Inventors: Szu-Ying Chen, Miaoli County (TW); Jeng-Shyan Lin, Tainan (TW); Dun-Nian Yaung, Taipei (TW); Jen-Cheng Liu, Hsin-Chu (TW); Chia-Wei Liu, Changhua County (TW); Chung-Chuan Tseng, Hsinchu (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 973 days.

(21) Appl. No.: 13/630,185

(22) Filed: Sep. 28, 2012

(65) Prior Publication Data
US 2014/0090882 A1 Apr. 3, 2014

(51) Int. Cl.
*H01L 23/522* (2006.01)
*H01L 23/528* (2006.01)
(Continued)

(52) U.S. Cl.
CPC ......... *H05K 1/0296* (2013.01); *H01L 23/522* (2013.01); *H01L 23/5283* (2013.01);
(Continued)

(58) Field of Classification Search
CPC .... H01L 23/522; H01L 23/562; H05K 1/0296
(Continued)

(56) References Cited

U.S. PATENT DOCUMENTS 7,057,296 B2    6/2006  Hung et al.
7,157,734 B2    1/2007  Tsao et al.
(Continued)

FOREIGN PATENT DOCUMENTS

JP      2000195896 A    7/2000
JP      2002016065 A    1/2002
(Continued)

OTHER PUBLICATIONS

Japanese Office action dated Sep. 2, 2014.
(Continued)

*Primary Examiner* — Moazzam Hossain
*Assistant Examiner* — Omar Mojaddedi
(74) *Attorney, Agent, or Firm* — Cooper Legal Group, LLC

(57) ABSTRACT

One or more techniques or systems for mitigating peeling associated with a pad, such as a pad of a semiconductor, are provided herein. In some embodiments, a pad structure for mitigating peeling comprises a bond region located above a first region. In some embodiments, a first inter-layer dielectric region associated with the first region is formed in an inter-layer region under the pad. Additionally, a first inter-metal dielectric region associated with the first region is formed in an inter-metal region under the inter-layer region. In some embodiments, the first inter-metal region is formed under the first inter-layer region. In this manner, peeling associated with the pad structure is mitigated, at least because the first inter-metal dielectric region comprises dielectric material and the first inter-layer dielectric region comprises dielectric material, thus forming a dielectric-dielectric interface between the first inter-metal dielectric region and the inter-layer dielectric region.

20 Claims, 5 Drawing Sheets

(51) Int. Cl.
*H05K 1/02* (2006.01)
*H05K 1/11* (2006.01)
*H01L 23/00* (2006.01)

(52) U.S. Cl.
CPC ............ *H01L 23/562* (2013.01); *H05K 1/115* (2013.01); *H01L 24/05* (2013.01); *H01L 2224/05093* (2013.01); *H01L 2224/05568* (2013.01)

(58) Field of Classification Search
USPC ....................................................... 257/786
See application file for complete search history.

(56) References Cited

U.S. PATENT DOCUMENTS

| | | | |
|---|---|---|---|
| 7,741,207 B2 | 6/2010 | Hashimoto et al. | |
| 2002/0000668 A1* | 1/2002 | Sakihama | H01L 24/05 257/758 |
| 2003/0020163 A1* | 1/2003 | Hung | H01L 24/05 257/734 |
| 2005/0067707 A1* | 3/2005 | Hashimoto | H01L 24/03 257/758 |
| 2006/0154470 A1* | 7/2006 | Pozder | H01L 23/522 438/618 |
| 2010/0096760 A1* | 4/2010 | Yu | H01L 24/05 257/774 |
| 2012/0211902 A1* | 8/2012 | Jeng | H01L 24/05 257/784 |
| 2013/0153269 A1* | 6/2013 | Takahashi | H05K 3/368 174/254 |
| 2013/0154106 A1* | 6/2013 | Hu | H01L 24/96 257/774 |
| 2013/0299219 A1* | 11/2013 | Chisaka | H05K 1/0271 174/257 |

FOREIGN PATENT DOCUMENTS

| | | |
|---|---|---|
| JP | 2002222811 A | 8/2002 |
| JP | 2008235944 A | 10/2008 |
| JP | 2009010065 A | 1/2009 |
| JP | 2011-248386 | 12/2011 |
| KR | 1020060078386 A | 7/2006 |

OTHER PUBLICATIONS

English Translation of Japanese Office action dated Sep. 2, 2014.
Korean Notice of Allowance dated Aug. 5, 2014.
Corresponding Japanese Application, Japanese Office action dated Feb. 23, 2016, 11 pages.

* cited by examiner

PAD STRUCTURE

BACKGROUND

Generally, a region below a bond region of a stack is associated with a force, such as a bonding force. Additionally, when the force is applied to the stack, an interface between a first region comprising a first type of material and a second region comprising a second type of material often peels apart. For example, an interface between a dielectric region and a metal peels apart at the interface between the respective regions when subject to the force associated with the bond region.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for mitigating peeling associated with a pad structure are provided herein. In some embodiments, a pad structure for mitigating peeling comprises a bond region located above a first region. Generally, the first region is associated with force from the bond region. For example, such force peels an interface between a first material, such as a dielectric, and a second material, such as a metal, apart. Accordingly, the pad structure is designed such that no differing material interfaces, such as a dielectric-metal interface, are situated in the first region or the region under the bond region. For example, the pad structure comprises a pad under the bond region. Additionally, the pad is located above at least one of the first region, a second region, or a third region. In some embodiments, the pad structure comprises an inter-layer region under the pad. For example, the inter-layer region comprises a first inter-layer dielectric region associated with the first region, a first pad connection associated with the second region, and a second pad connection associated with the third region. It will be appreciated that the first inter-layer dielectric region associated with the first region is comprised of dielectric material. In some embodiments, the pad structure comprises an inter-metal region under the inter-layer region. For example, the inter-metal region comprises a first inter-metal dielectric region associated with the first region, a second inter-metal region associated with the second region, and a third inter-metal region associated with the third region. Similarly to the first inter-layer dielectric region of the inter-layer region, the first inter-metal dielectric region of the inter-metal region is comprised of dielectric material. In this way, the first inter-metal dielectric region is configured to mitigate peeling associated with the pad structure, at least because the first inter-layer dielectric region and the first inter-metal dielectric region comprise a dielectric-dielectric interface, rather than a dielectric-metal interface. In other words, the pad structure is designed such that no interfaces of the first region under the bond region comprise differing material types, such as dielectric-metal.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
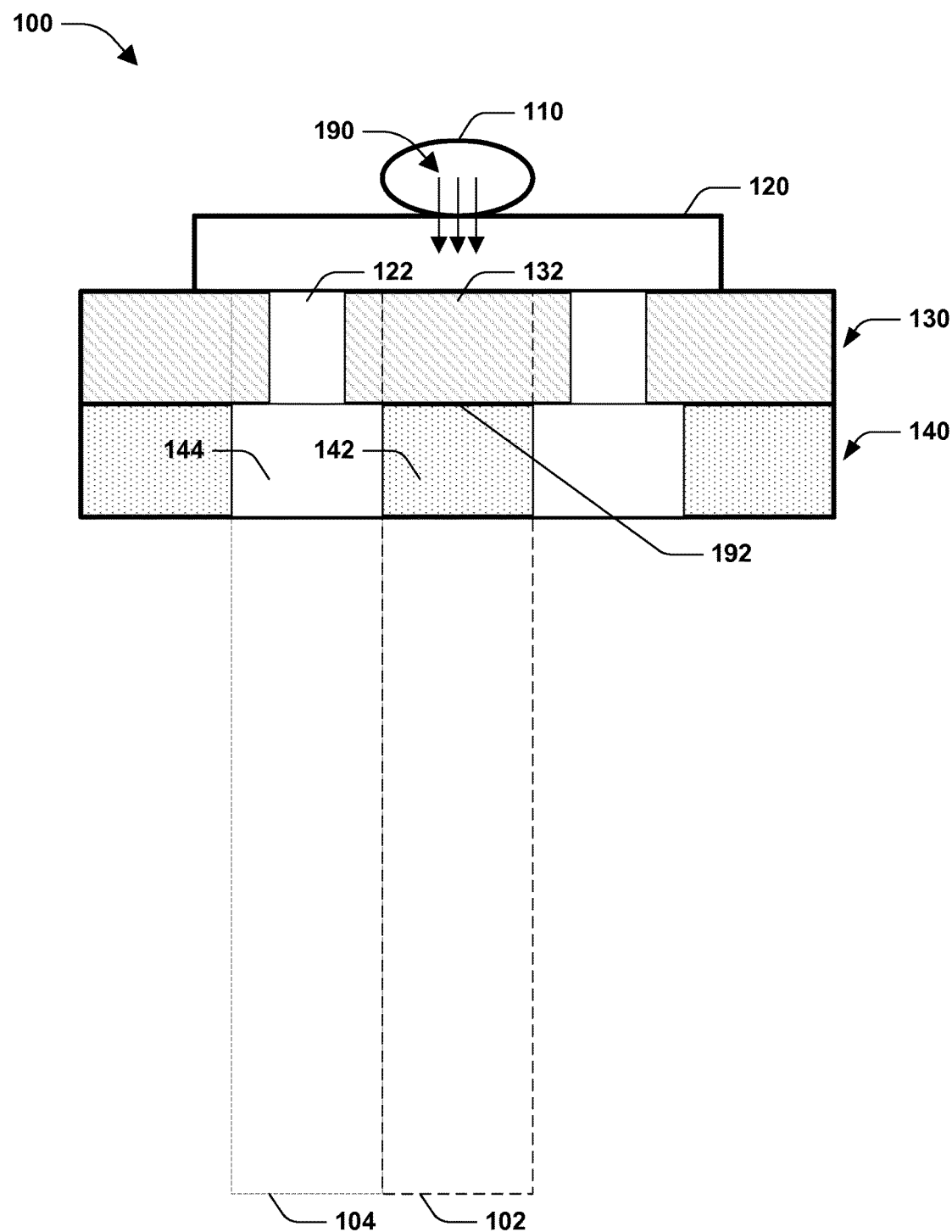
FIG. 1 is a cross-sectional view of an example pad structure for mitigating peeling, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

FIG. 1 is a cross-sectional view of an example pad structure 100 for mitigating peeling, according to some embodiments. For example, the pad structure 100 of FIG. 1 comprises a bond region 110, a pad 120, an inter-layer region 130, and an inter-metal region 140. In some embodiments, the bond region 110 is located above a first region 102, the pad 120 is located under the bond region 110 and above at least one of the first region 102 or the second region 104, the inter-layer region 130 is located under the pad 120, and the inter-metal region 140 is located under the inter-layer region 130. In some embodiments, the pad structure 100 comprises one or more additional inter-metal regions. In some embodiments, the inter-layer region 130 comprises a first inter-layer dielectric region 132 and a first pad connection 122. For example, the first inter-layer dielectric region 132 is associated with a first region 102 and the first pad connection 122 is generally associated with a second region 104. In some embodiments, the inter-metal region 140 comprises a first inter-metal dielectric region 142 and a second inter-metal region 144. For example, the first inter-metal dielectric region 142 is associated with the first region 102 and the second inter-metal region 144 is associated with the second region 104. In some embodiments, the second inter-metal region 144 is located under the first pad connection 122. In some embodiments, a first region 102 is located under at least one of the bond region 110 or the pad 120. For example, the first region 102 is associated with a force 190, at least because the bond region 110 is not flush with the pad 120. For example, force 190 is applied down from the bond region 110 through the pad 120 to at least one of the inter-layer region 130 or the inter-metal region 140 when the bond region 110 is in contact with a circuit board. In some embodiments, force 190 is a package bonding force. In some embodiments, a second region 104 is located under the pad 120 and not under the bond region 110. It will be appreciated that force 190 is applied to at least one of the first inter-layer dielectric region 132 or the first inter-metal dielectric region 142, at least because respective regions are at least one of associated with the first region 102 or located under the bond region 110.

In some embodiments, the inter-layer region 130 comprises at least one of a dielectric or a metal. For example, the first inter-layer dielectric region 132 of the inter-layer region 130 comprises dielectric material. Additionally, the first pad connection 122 of the inter-layer region 130 comprises metal. It will be appreciated that the first pad connection 122 is substantially associated with the second region 104, but is associated with a portion of neighboring regions, such as a portion of the first region 102, in some embodiments. Similarly, the inter-metal region 140 comprises at least one of a dielectric or a metal. For example, the first inter-metal dielectric region 142 of the inter-metal region 140 comprises dielectric material. In this way, a dielectric-dielectric interface 192 is formed between the first inter-layer dielectric region 132 and the first inter-metal dielectric region 142. It will be appreciated that the dielectric-dielectric interface 192 mitigates peeling associated with the first inter-layer dielectric region 132 and the first inter-metal dielectric region 142, for example. In this way, the first inter-metal dielectric region 142 is configured to mitigate peeling associated with the pad structure 100. Additionally, the second inter-metal region 144 of the inter-metal region 140 comprises metal. It will be appreciated that at least one of the first region 102 or the second region 104 is not necessarily drawn to scale, and comprises a flexible size in some embodiments. For example, the first region 102 is associated with a force 190, such as a package bonding force and extends as far as the force 190 is associated with material interfaces.

Figure 2:
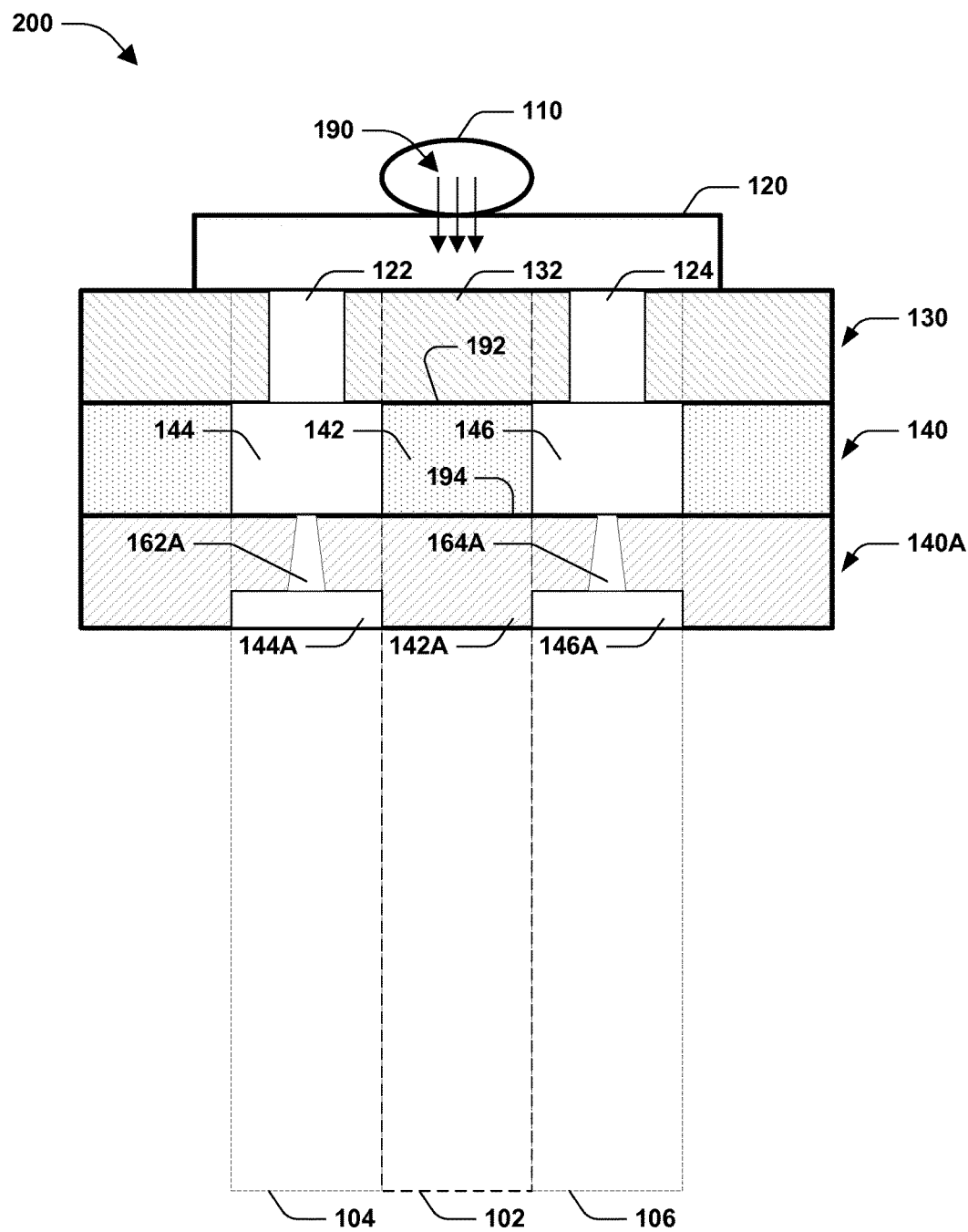
FIG. 2 is a cross-sectional view of an example pad structure for mitigating peeling, according to some embodiments.

FIG. 2 is a cross-sectional view of an example pad structure 200 for mitigating peeling, according to some embodiments. For example, the pad structure 200 of FIG. 2 comprises a bond region 110, a pad 120, an inter-layer region 130, an inter-metal region 140, and a first additional inter-metal region 140A located under the inter-metal region 140. It will be appreciated that in some embodiments, the pad structure 200 comprises one or more additional inter-metal regions, as will be described herein. In some embodiments, the inter-layer region 130 comprises a first inter-layer dielectric region 132, a first pad connection 122, and a second pad connection 124. For example, the first inter-layer dielectric region 132 is associated with a first region 102, the first pad connection 122 is generally associated with a second region 104, and the second pad connection is generally associated with a third region 106. In some embodiments, the inter-metal region 140 comprises a first inter-metal dielectric region 142, a second inter-metal region 144, and a third inter-metal region 146. For example, the first inter-metal dielectric region 142 is associated with the first region 102, the second inter-metal region 144 is associated with the second region 104, and the third inter-metal region 146 is associated with the third region 106. In some embodiments, the first additional inter-metal region 140A comprises a first additional inter-metal dielectric region 142A, a second additional inter-metal region 144A, and a third additional inter-metal region 146A. Additionally, the first additional inter-metal region 140A comprises a first via 162A associated with a second region 104 and a second via 164A associated with a third region 106. The first additional inter-metal dielectric region 142A is associated with the first region 102, the second additional inter-metal region 144A is associated with the second region 104, and the third additional inter-metal region 146A is associated with the third region 104.

In some embodiments, a first region 102 is located under at least one of the bond region 110 or the pad 120. The first region 102 is associated with force 190, at least because the bond region 110 is situated such that the bond region 110 protrudes from the pad 120. In some scenarios, force 190 is applied down from the bond region 110 through the pad 120 to at least one of the inter-layer region 130, the inter-metal region 140, or the additional inter-metal region 140A when the bond region 110 is in contact with a socket, for example. In some embodiments, a second region 104 and a third region 106 are located under the pad 120 and not under the bond region 110. Accordingly, force 190 is applied to at least one of first inter-layer dielectric region 132, the first inter-metal dielectric region 142, or the first additional inter-metal dielectric region 142A, at least because respective regions are at least one of associated with the first region 102 or located under the bond region 110.

In some embodiments, the inter-layer region 130 comprises at least one of a dielectric or a metal. For example, the first inter-layer dielectric region 132 of the inter-layer region 130 comprises dielectric material. Additionally, at least one of the first pad connection 122 or the second pad connection 124 of the inter-layer region 130 comprises metal. It will be appreciated that the first pad connection 122 is substantially associated with the second region 104, but is associated with at least a portion of neighboring regions, such as a portion of the first region 102, in some embodiments. Similarly, the second pad connection 124 is substantially associated with the third region 106, but is associated with at least a portion of neighboring regions, such as a portion of the first region 102, in some embodiments. In some embodiments, at least one of the second region 104 or the third region 106 is based on a width of at least one of the second inter-metal region 144 or the third inter-metal region 146.

In some embodiments, at least one of the inter-metal region 140 or the first additional inter-metal region 140A comprises at least one of a dielectric or a metal. For example, at least one of the first inter-metal dielectric region 142 of the inter-metal region 140 or the first additional inter-metal dielectric region 142A of the first additional inter-metal region 140A comprises dielectric material. In some embodiments, at least one of the second inter-metal region 144 or the third inter-metal region 146 of the inter-metal region 140 comprises metal. Similarly, at least one of the second additional inter-metal region 144A or the third additional inter-metal region 146A of the first additional inter-metal region 140A comprises metal. In some embodiments, at least one of the first via 162A or the second via 164A of the first additional inter-metal region 140A comprises metal.

In some embodiments, a first dielectric-dielectric interface 192 is formed between the first inter-layer dielectric region 132 of the inter-layer region 130 and the first inter-metal dielectric region 142 of the inter-metal region 140, at least because the first inter-layer dielectric region 132 is at least one of adjacent to or located above the first inter-metal dielectric region 142. Similarly, a second dielectric-dielectric interface 194 is formed between the first inter-metal dielectric region 142 of the inter-metal region 140 and the first additional inter-metal dielectric region 142A of the first additional inter-metal region 140A, at least because the first inter-metal dielectric region 142 is at least one of adjacent to or located above the first additional inter-metal dielectric region 142A. In some embodiments, at least one of the first dielectric-dielectric interface 192 or the second dielectric-dielectric interface 194 is configured to mitigate peeling associated with pad structure 200. For example, at least one of the first dielectric-dielectric interface 192 or the second dielectric-dielectric interface 194 is associated with the first region 102, at least because respective interfaces are located under the bond region 110. Additionally, at least one of the first dielectric-dielectric interface 192 or the second dielectric-dielectric interface 194 does not comprise a dielectric-metal interface for force 190 to peel. In this way, peeling associated with pad structure 200 is mitigated.

Figure 3:
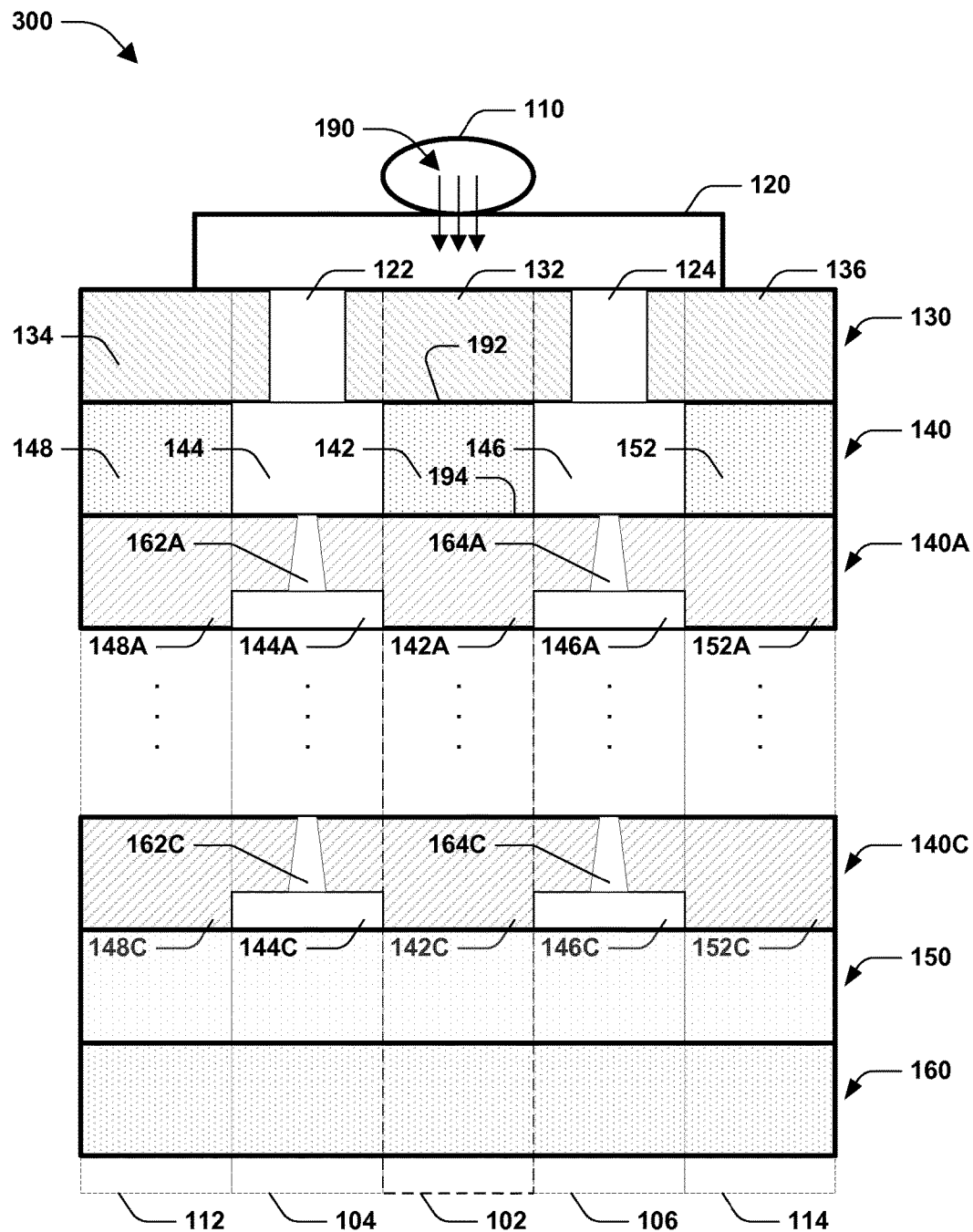
FIG. 3 is a cross-sectional view of an example pad structure for mitigating peeling, according to some embodiments.

FIG. 3 is a cross-sectional view of an example pad structure 300 for mitigating peeling, according to some embodiments. For example, the pad structure 300 of FIG. 3 is similar to the pad structure 200 of FIG. 2, except that pad structure 300 comprises top-metal region 140C. It will be appreciated that pad structure 300 comprises any number of additional inter-metal regions. Additionally, in some embodiments, the pad structure 300 comprises a passivation oxide region 150 and a carrier wafer 160. In some embodiments, the pad structure 300 is associated with a first region 102, a second region 104, a third region 106, a fourth region 112, and a fifth region 114.

In some embodiments, the pad structure 300 of FIG. 3 comprises a bond region 110 located above a first region 102, a pad 120 located under the bond region 110 and above at least one of a first region 102, a second region 104, or a third region 106. Additionally, the pad structure 300 comprises an inter-layer region 130 located under the pad 120, an inter-metal region 140 located under the inter-layer region 130, a first additional inter-metal region 140A located under the first inter-metal region 140, one or more additional inter-metal regions (not shown), a top-metal region 140C, a passivation oxide region 150 located under the top-metal region 140C, and a carrier wafer 160 located under the passivation oxide region 150.

In some embodiments, the inter-layer region 130 comprises a first inter-layer dielectric region 132 associated with the first region 102, a first pad connection 122 associated with the second region 104, a second pad connection 124 associated with the third region 106, a second inter-layer dielectric region 134 associated with the fourth region 112, and a third inter-layer dielectric region 136 associated with the fifth region 114. In some embodiments, at least one of the first inter-layer dielectric region 132, the second inter-layer dielectric region 134, or the third inter-layer dielectric region 136 is associated with a neighboring region. For example, the first inter-layer dielectric region 132 is primarily associated with the first region 102, but also associated with at least a portion of at least one of the second region 104 or the third region 106. The second inter-layer dielectric region 134 is primarily associated with the fourth region 112, but also associated with the second region 104. Similarly, the third inter-layer dielectric region 136 is primarily associated with the fifth region 114, but also associated with the third region 106 in some embodiments. Accordingly, it will be appreciated that, any portions, layers, regions, etc. of the pad structure 300 are associated with one or more regions, such as at least one of the first region 102, the second region 104, the third region 106, the fourth region 112, or the fifth region 114, in some embodiments.

In some embodiments, the inter-metal region 140 comprises a first inter-metal dielectric region 142 associated with the first region 102, a second inter-metal region 144 associated with the second region 104, a third inter-metal region 146 associated with the third region 106, a second inter-metal dielectric region 148 associated with the fourth region 112, and a third inter-metal dielectric region 152 associated with the fifth region 114.

In some embodiments, the first additional inter-metal region 140A comprises a first additional inter-metal dielectric region 142A associated with the first region 102, a second additional inter-metal region 144A associated with the second region 104, a third additional inter-metal region 146A associated with the third region 106, a second additional inter-metal dielectric region 148A associated with the fourth region 112, and a third additional inter-metal dielectric region 152A associated with the fifth region 114. Additionally, the first additional inter-metal region 140A comprises a first via 162A associated with the second region 104 and a second via 164A associated with the third region 106. For example, the first via 162A is located above the second additional inter-metal region 144A and the second via 164A is located above the third additional inter-metal region 146A.

Similarly, the top-metal region 140C comprises a first top-metal dielectric region 142C associated with the first region 102, a second top-metal region 144C associated with the second region 104, a third top-metal region 146C associated with the third region 106, a second top-metal dielectric region 148C associated with the fourth region 112, and a third top-metal dielectric region 152C associated with the fifth region 114. Additionally, the top-metal region 140C comprises a first via 162C associated with the second region 104 and a second via 164C associated with the third region 106. For example, the first via 162C is located above the second top-metal region 144C and the second via 164C is located above the third top-metal region 146C.

In some embodiments, the passivation oxide layer 150 is located under the top-metal layer 140C. Additionally, a carrier wafer 160 is located under the passivation oxide layer 150. In some embodiments, at least one of 120, 122, 124, 144, 146, 162A, 164A, 144A, 146A, 162C, 164C, 144C, 146C, etc. comprise metal. It will be appreciated that at least one of regions 132, 134, 136, 142, 148, 152, 142A, 148A, 152A, 142C, 148C, 152C, etc. comprise dielectric material. In this way, one or more dielectric-dielectric interfaces are formed between different regions of the first region 102. For example, a first dielectric-dielectric interface 192 is formed between the inter-layer region 130 and the inter-metal region 140 at least because the first inter-layer dielectric region 132 of the inter-layer region 130 is adjacent to the first inter-metal dielectric region 142 of the inter-metal region 140. Additionally, a second dielectric-dielectric interface 194 is formed between the inter-metal region 140 and the first additional inter-metal region 140A at least because the first inter-metal dielectric region 142 of the inter-metal region 140 is adjacent to the first additional inter-metal dielectric region 142A of the first additional inter-metal region 140A. It will be appreciated that one or more dielectric-dielectric interfaces are formed within the first region 102 such that the first region does not comprise a dielectric-metal interface.

Figure 4:
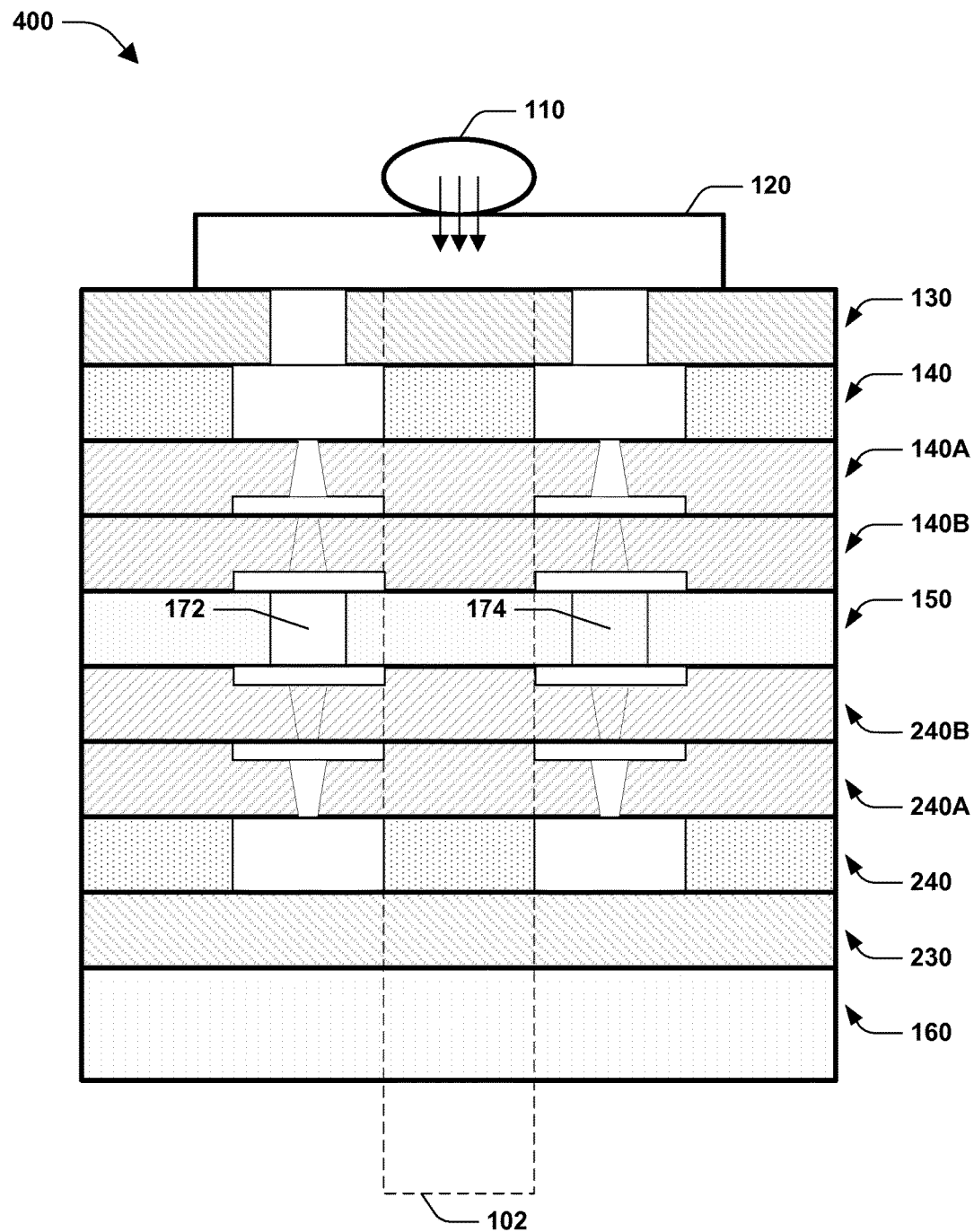
FIG. 4 is a cross-sectional view of an example pad structure for mitigating peeling, according to some embodiments.

FIG. 4 is a cross-sectional view of an example pad structure 400 for mitigating peeling, according to some embodiments. In some embodiments, pad structure 400 is a three-dimensional version of pad structure 300 of FIG. 3. For example, the pad structure 400 is associated with a three-dimensional architecture, rather than the 2-d architecture of the pad structure 300 of FIG. 3. For example, pad structure 400 comprises a bond region 110 above a pad 120, a pad 120 above an inter-layer region 130, an inter-layer region 130 above an inter-metal region 140, and inter-metal region 140 above a first additional inter-metal region 140A, a first additional inter-metal region 140A above a top-metal region 140B, a top-metal region 140B above a passivation oxide region 150, a passivation oxide region 150 above a second top-metal region 240B, a second top-metal region above a second additional inter-metal region 240A, a second additional inter-metal region 240A above a second inter-metal region 240, a second inter-metal region 240 above a second inter-layer region 230, a second inter-layer region 230 above an ASIC wafer 160. In some embodiments, the passivation oxide region 150 comprises a first re-distribution layer 172 and a second re-distribution layer 174. In some embodiments, a first region 102 is merely associated with dielectric material such that merely dielectric-dielectric interfaces are present within the first region 102.

Figure 5:
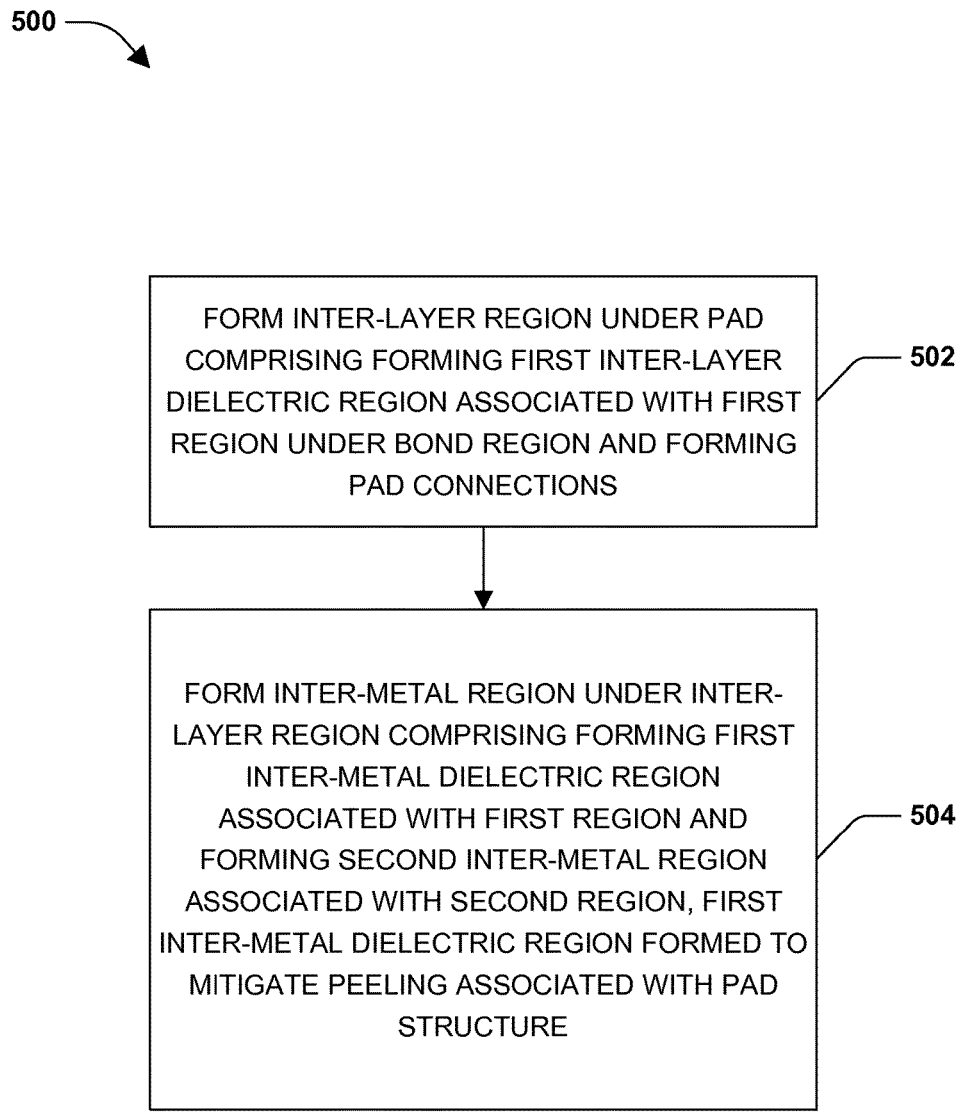
FIG. 5 is a flow diagram of an example method for mitigating peeling associated with a pad structure, according to some embodiments.

FIG. 5 is a flow diagram of an example method 500 for mitigating peeling associated with a pad structure, according to some embodiments. For example, the method 500 comprises forming an inter-layer region under a pad at 502. In some embodiments, forming the inter-layer region 502 comprises forming a first inter-layer dielectric region associated with a first region, the first region under a bond region. Additionally, forming the inter-layer region 502 comprises forming one or more pad connections. In some embodiments, the method 500 comprises forming an inter-metal region under the inter-layer region at 504. For example, forming the inter-metal region 504 comprises forming a first inter-metal dielectric region associated with the first region and forming a second inter-metal region associated with the second region. In this way, the first inter-metal dielectric region formed to mitigate peeling associated with the pad structure, at least because the first inter-metal dielectric region is formed under the first inter-layer dielectric region such that a dielectric-dielectric interface is formed between the respective regions.

In some embodiments, forming the inter-layer region 502 comprises forming a first pad connection associated with the second region and forming a second pad connection associated with a third region. In some embodiments, forming the inter-layer region 502 comprises forming a second inter-layer dielectric region associated with a fourth region and forming a third inter-layer dielectric region associated with a fifth region.

In some embodiments, forming the inter-metal region 504 comprises forming a third inter-metal region associated with a third region. In some embodiments, forming the inter-metal region 504 comprises forming a fourth inter-metal dielectric region associated with a fourth region and forming a fifth inter-metal dielectric region associated with a fifth region.

According to some aspects, a pad structure for mitigating peeling is provided, comprising a bond region located above a first region. In some embodiments, the pad structure comprises a pad under the bond region, and the pad is located above at least one of the first region or a second region. In some embodiments, the pad structure comprises an inter-layer region under the pad, the inter-layer region comprising a first inter-layer dielectric region associated with the first region and one or more pad connections. In some embodiments, the pad structure comprises an inter-metal region under the inter-layer region comprising a first inter-metal dielectric region associated with the first region and a second inter-metal region associated with the second region. Additionally, the first inter-metal dielectric region is configured to mitigate peeling associated with the pad structure.

According to some aspects, a method for mitigating peeling associated with a pad structure is provided, comprising forming an inter-layer region under a pad. For example, forming the inter-layer region comprises forming a first inter-layer dielectric region associated with a first region, the first region under a bond region and forming one or more pad connections. In some embodiments, the method comprises forming an inter-metal region under the inter-layer region. For example, forming the inter-metal region comprises forming a first inter-metal dielectric region associated with the first region and forming a second inter-metal region associated with the second region. Additionally, the first inter-metal dielectric region is formed to mitigate peeling associated with the pad structure.

According to some aspects, a pad structure for mitigating pad peeling is provided, comprising a bond region located above a first region. In some embodiments, the pad structure comprises a pad under the bond region. For example, the pad located above at least one of the first region, a second region, or a third region. In some embodiments, the pad structure comprises an inter-layer region under the pad. For example, the inter-layer region comprises a first inter-layer dielectric region associated with the first region, a first pad connection associated with the second region, and a second pad connection associated with the third region. In some embodiments, the pad structure comprises an inter-metal region under the inter-layer region. For example, the inter-metal region comprises a first inter-metal dielectric region associated with the first region, a second inter-metal region associated with the second region, and a third inter-metal region associated with the third region. Additionally, the first inter-metal dielectric region is configured to mitigate peeling associated with the pad structure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, elements, such as the bond region, the pad, the inter-layer region, the inter-metal region, the vias, the additional inter-metal regions, the top-metal region, the passivation oxide region, the re-distribution layer (RDL), etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as implanting techniques, doping techniques, spin-on techniques, sputtering techniques such as magnetron or ion beam sputtering, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A pad structure for mitigating peeling, comprising:
   a bond region located above a first region;
   a pad under the bond region, wherein the pad is located above at least one of the first region or a second region;
   an inter-layer region under the pad, wherein:
      the inter-layer region comprises a first inter-layer dielectric region associated with the first region and one or more pad connections; and
      the first inter-layer dielectric region has a first width;
   a first inter-metal region under the inter-layer region, wherein:
      the first inter-metal region comprises a first inter-metal dielectric region associated with the first region and a first metal region associated with the second region; and
      the first inter-metal dielectric region has a second width;
   a second inter-metal region under the first inter-metal region, wherein:
      the second inter-metal region comprises a first non-tapered metal portion and a first tapered via over the first non-tapered metal portion; and
      a width of the first tapered via at a location where the first tapered via abuts the first metal region is less than a width of the first tapered via at a location where the first tapered via abuts the first non-tapered metal portion; and
   a passivation region under the second inter-metal region, wherein the passivation region comprises a redistribution element underlying the first non-tapered metal portion and having a non-tapered sidewall.

2. The pad structure of claim 1, wherein:
   a first pad connection of the one or more pad connections is associated with the second region and a second pad connection of the one or more pad connections is associated with a third region located under at least a portion of the pad;
   the first inter-metal region comprises a second metal region associated with the third region; and
   the first inter-metal dielectric region is between the first metal region and the second metal region.

3. The pad structure of claim 2, wherein:
   the inter-layer region comprises a second inter-layer dielectric region associated with a fourth region and a third inter-layer dielectric region associated with a fifth region; and
   the first inter-metal region comprises a second inter-metal dielectric region associated with the fourth region and a third inter-metal dielectric region associated with the fifth region.

4. The pad structure of claim 1, comprising:
   a third inter-metal region under the passivation region, wherein:
      the third inter-metal region comprises a second non-tapered metal portion and a second tapered via under the second non-tapered metal portion; and
      a width of the second tapered via at a location where the second tapered via abuts the second non-tapered metal portion is greater than a width of the second tapered via at a location where the second tapered via abuts a region under the second tapered via.

5. The pad structure of claim 1, comprising a third inter-metal region under the second inter-metal region, wherein:
   the third inter-metal region comprises a second non-tapered metal portion and a second tapered via over the second non-tapered metal portion; and
   a width of the second tapered via at a location where the second tapered via abuts the first non-tapered metal portion is less than a width of the second tapered via at a location where the second tapered via abuts the second non-tapered metal portion.

6. The pad structure of claim 5, wherein the redistribution element is in contact with the second non-tapered metal portion.

7. The pad structure of claim 6, comprising:
   a fourth inter-metal region under the passivation region, wherein:
      the fourth inter-metal region comprises a third non-tapered metal portion and a third tapered via under the third non-tapered metal portion; and
      a width of the third tapered via at a location where the third tapered via abuts the third non-tapered metal portion is greater than a width of the third tapered via at a location where the third tapered via abuts a region under the third tapered via.

8. The pad structure of claim 1, wherein:
   an interface is defined between the bond region and the pad; and
   there is no metal vertically underlying the interface, in the first inter-metal region, to mitigate peeling associated with the pad structure.

9. The pad structure of claim 1, comprising a top-metal region under the first inter-metal region, wherein the top-metal region comprises a first top-metal dielectric region associated with the first region and a second metal region associated with the second region.

10. The pad structure of claim 9, wherein the top-metal region comprises a third metal region associated with a third region.

11. The pad structure of claim 9, wherein the top-metal region comprises a second top-metal dielectric region associated with a fourth region and a third top-metal dielectric region associated with a fifth region.

12. The pad structure of claim 1, the passivation region comprising an oxide.

13. The pad structure of claim 1, wherein first inter-layer dielectric region contacts a top surface of the first metal region of the first inter-metal region.

14. A pad structure for mitigating pad peeling, comprising:
    a bond region located above a first region;
    a pad under the bond region, wherein:

the pad is located above at least one of the first region, a second region, or a third region; and an interface is defined between the bond region and the pad;

an inter-layer region under the pad, wherein the inter-layer region comprises a first inter-layer dielectric region associated with the first region, a first pad connection associated with the second region, and a second pad connection associated with the third region;

a first inter-metal region under the inter-layer region, wherein:

the first inter-metal region comprises a first inter-metal dielectric region associated with the first region, a first metal region associated with the second region, and a second metal region associated with the third region; and there is no metal vertically underlying the interface in the first inter-metal region to mitigate peeling associated with the pad structure;

a second inter-metal region under the first inter-metal region, wherein:

the second inter-metal region comprises a first non-tapered metal portion and a first tapered via over the first non-tapered metal portion; and a width of the first tapered via at a location where the first tapered via abuts the first metal region is less than a width of the first tapered via at a location where the first tapered via abuts the first non-tapered metal portion; and a passivation region under the second inter-metal region, wherein the passivation region comprises a redistribution element underlying the first non-tapered metal portion and having a non-tapered sidewall.

15. A pad structure for mitigating pad peeling, comprising:

a bond region;

a pad, wherein at least some of the bond region vertically overlaps the pad;

an inter-layer region under the pad, wherein:

the inter-layer region comprises a first inter-layer dielectric region;

at least some of the bond region vertically overlaps the first inter-layer dielectric region; and the first inter-layer dielectric region has a first width;

a first inter-metal region under the inter-layer region, wherein:

the first inter-metal region comprises a first inter-metal dielectric region and a first metal region;

the bond region entirely vertically overlaps the first inter-metal dielectric region and does not vertically overlap the first metal region; and the first inter-metal dielectric region has a second width;

a second inter-metal region under the first inter-metal region, wherein the second inter-metal region comprises a non-tapered metal portion; and a passivation region under the first inter-metal region, wherein the passivation region comprises a redistribution element underlying the non-tapered metal portion and having a non-tapered sidewall.

16. The pad structure of claim 15, wherein the first inter-metal dielectric region is in contact with the first inter-layer dielectric region.

17. The pad structure of claim 15, wherein the inter-layer region comprises an electrically conductive pad connection for electrically coupling the first metal region of the first inter-metal region to the pad.

18. The pad structure of claim 15, wherein the inter-layer region comprises a first pad connection electrically coupled to the pad and a second pad connection electrically coupled to the pad.

19. The pad structure of claim 18, wherein:

the first inter-metal region comprises a first metal portion electrically coupled to the first pad connection and a second metal portion electrically coupled to the second pad connection; and the first inter-metal dielectric region is disposed between the first metal portion and the second metal portion.

20. The pad structure of claim 15, wherein:

the second inter-metal region comprises a tapered via over the non-tapered metal portion;

a width of the tapered via at a first location where the tapered via abuts the first metal region is less than a width of the tapered via at a second location where the tapered via abuts the non-tapered metal portion; and the pad structure comprises a carrier wafer under the passivation region, wherein every tapered via between the passivation region and the first inter-metal region is tapered in a same first direction and every tapered via between the passivation region and the carrier wafer is tapered in a same second direction different than the first direction.

* * * * *